United States Patent [19]

Sauer

[11] Patent Number: 5,500,612
[45] Date of Patent: Mar. 19, 1996

[54] CONSTANT IMPEDANCE SAMPLING SWITCH FOR AN ANALOG TO DIGITAL CONVERTER

[75] Inventor: Donald J. Sauer, Monmouth, N.J.

[73] Assignee: David Sarnoff Research Center, Inc., Princeton, N.J.

[21] Appl. No.: 247,156

[22] Filed: May 20, 1994

[51] Int. Cl.⁶ .......................... H03K 17/16; G11C 27/02
[52] U.S. Cl. .......................... 327/91; 327/390; 327/589
[58] Field of Search ............................. 327/91–96, 148, 327/390, 536, 589, 427, 434, 435, 374–377, 579; 326/88

[56] References Cited

U.S. PATENT DOCUMENTS

4,527,074  7/1985  Donaldson et al. ................. 327/536
4,734,599  3/1988  Bohac, Jr. ........................... 327/356
5,084,634  1/1992  Gorecki .............................. 327/91
5,172,019  12/1992 Naylor et al. ...................... 327/390

Primary Examiner—Toan Tran
Attorney, Agent, or Firm—William J. Burke

[57] ABSTRACT

A constant impedance sampling switch suitable for a high-frequency analog-to-digital converter, presents a substantially constant impedance to the input signal regardless of the instantaneous level of the input signal. The exemplary sampling switch employs a single metal oxide semiconductor (MOS) transistor to selectively couple the input signal to a sampling circuit. The gate signal for this transistor is generated by circuitry which is disconnected from the gate of the transistor while the transistor is in an non-conductive state. During a sampling interval, the gate signal is bootstrapped by the instantaneous potential of the input signal to render the transistor conductive. Accordingly, the potential difference between the signal being sampled and the gate potential of the transistor remains substantially constant over a relatively wide range of amplitudes for the analog input signal.

7 Claims, 4 Drawing Sheets

FIG. 5

CONSTANT IMPEDANCE SAMPLING SWITCH FOR AN ANALOG TO DIGITAL CONVERTER

The invention relates to an analog-to-digital converter (ADC) which operates at high speed and provides high resolution, and more particularly, to a constant impedance sampling switch, suitable for use with such an ADC, to sample the analog input signal.

BACKGROUND OF THE INVENTION

To apply digital signal processing to real-world data, it is often necessary to convert an analog signal into a digital format. To insure reasonable fidelity in this conversion, it is desirable to sample the analog signal at a rate substantially greater than bandwidth of the analog signal. These sampled signal values are then converted sample by sample at high speed into their equivalent digital values represented by "N" number of binary bits. Prior art ADCs, which typically use bipolar transistors, are able to operate at high rates (e.g., 50 MHz) and with 12-bit resolution. These ADCs require relatively large amounts of electrical power and are very costly. On the other hand, attempts to implement high speed, multi-bit ADCs with MOS technology have not been as successful as desired. Either cost was high because of poor chip yield or performance was substantially less than could be obtained using bipolar transistor technology.

A prior ADC, termed an "N-flash" ADC, simultaneously produces "N" data bits in parallel from a sampled analog voltage. The ADC comprises $2^N-1$ comparators which are closely matched to each other with each capable of high resolution. The ADC circuit momentarily connects all of these comparators at once to an analog input sampling circuit. A decoder circuit coupled to all of the comparators then determines the values of the N bits corresponding to the analog value of the input signal being sampled at that instant. An advantage of this type of ADC is the high speed at which it can operate. An important disadvantage is relatively low impedance load (and corresponding large switching transients) caused by connecting all of the comparators to the input circuit at the same time. As an example, a 12 bit flash ADC uses 4095 comparators.

Another type of ADC is a successive approximation device. This type of ADC, in its simplest form, calculates an output digital value from a sampled analog potential one bit at a time, from the most significant bit to the least significant bit. As each bit of the output value is generated, the partial digital value is converted to an analog value by an internal digital to analog converter (DAC), and the analog value is subtracted from the original sample value. This difference value is then used to generate the next less significant bit of the digital output value. In this form, at least N comparison operations are needed to produce an N-bit digital value.

In a more complex form, this type of ADC employs N or more successive approximation stages in parallel, each operating on a respectively different staggered clocking phase. In this configuration, one N-bit digital output value is produced for each clock cycle. An exemplary successive approximation ADC is described in my earlier U.S. Pat. No. 5,272,481 entitled ANALOG TO DIGITAL CONVERTER which is hereby incorporated by reference for its teachings on successive approximation ADCs.

One problem with any type of ADC implemented in MOS technology is linearity in the impedance of the sampling circuit. Sampling circuits for ADCs typically include a transmission gate which is turned on to charge a sampling capacitance to the instantaneous potential of the analog input signal and turned off to hold the charge level on the sampling capacitance.

A transmission gate is typically implemented as a PMOS transistor and an NMOS transistor having common source and drain connections. Complementary control potentials are applied to the gate electrodes of the PMOS and NMOS devices such that, when both devices are turned on, a conductive path exists for the signal being transmitted regardless of the instantaneous signal voltage. As is well known, there is a threshold gate to source voltage ($V_{GS}$) below which MOS transistors do not conduct. When $V_{GS}$ is well above the threshold voltage, the transistor exhibits a linear impedance. When, however, $V_{GS}$ is close to the threshold voltage, the transistor exhibits a nonlinear impedance. By carefully selecting the size ratio between the NMOS and PMOS devices, the total impedance due to the parallel combination of the two devices can be made relatively constant when both devices are above their threshold voltages. This constant impedance, however, is generally restricted to a relatively small range. For signals outside of this range, the paired devices may exhibit nonlinear impedance. This nonlinear impedance may produce harmonic distortion in the signal that is being passed by the transmission gate.

SUMMARY OF THE INVENTION

The present invention is embodied in a constant impedance sampling switch for an analog-to-digital converter. This switch presents a substantially constant impedance regardless of the instantaneous level of the input signal. In accordance with the present invention, a voltage-controlled resistance element is used to selectively couple the input signal to a sampling circuit. The control voltage for this element is generated by circuitry which is disconnected from the element while the element is in an non-conductive state. During a sampling interval, the voltage is increased by the instantaneous potential of the input signal and is applied as the control voltage for the voltage-controlled resistance element. Accordingly, the potential difference between the signal being sampled and the control potential remains substantially constant over a relatively wide range of amplitudes for the analog input signal.

DETAILED DESCRIPTION

Figure 1:
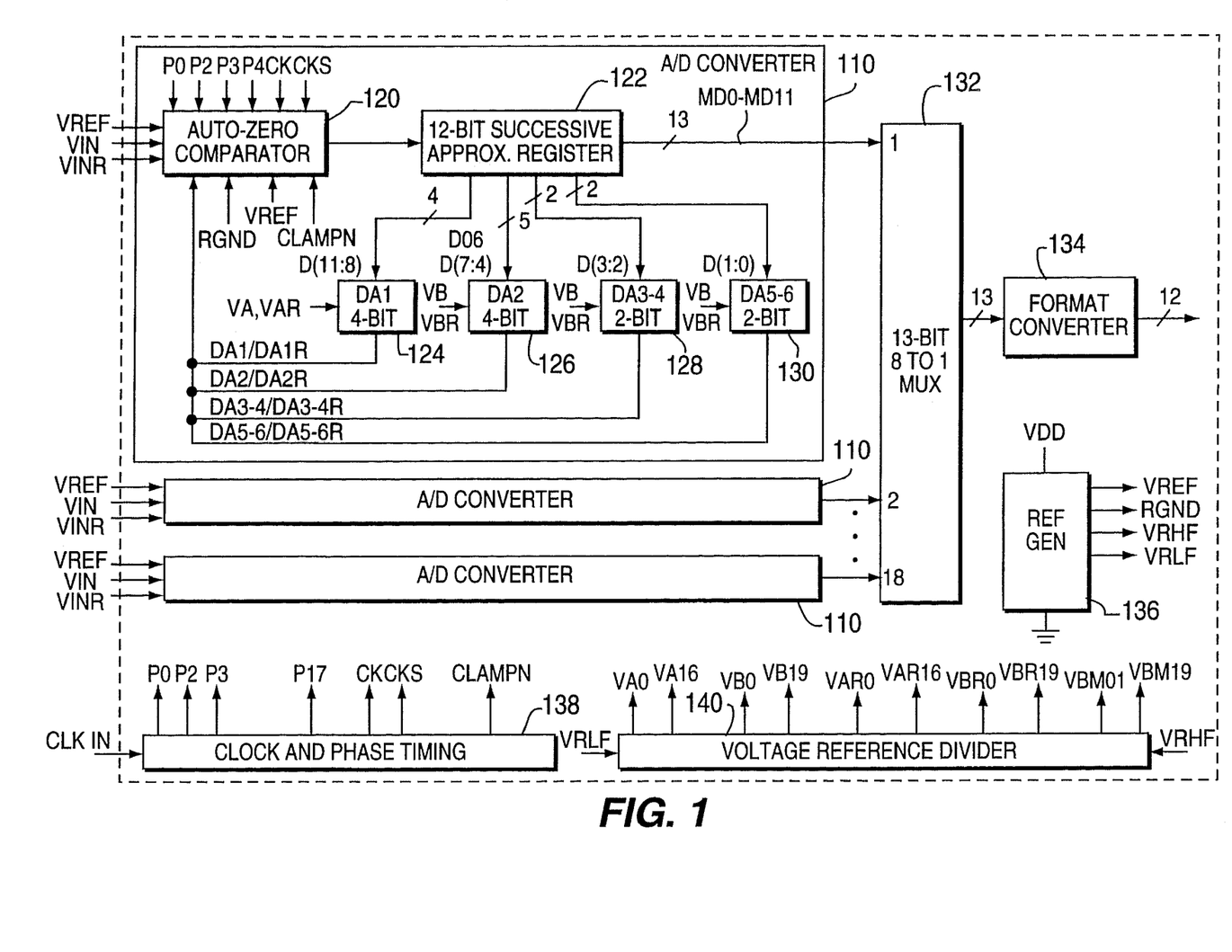
FIG. 1 is a block diagram of an ADC system which includes an embodiment of the present invention including an assembly of multiple ones of identical ADCs arranged in parallel and driven by skewed clock signals.

FIG. 1 is a block diagram of an ADC system which includes an embodiment of the present invention. This system includes 18 ADCs, which operate in parallel, responsive to phase-skewed clock signals in order to generate digital output samples corresponding to the analog input signal at a relatively high rate (e.g. 50 MHz). Each of these ADCs includes an auto-zero comparator 120, which receives the analog signal, VIN. Although the ADC system shown in FIG. 1 includes 18 ADCs, only one ADC is shown in detail. Each ADC 110 has an output port which is connected to a respective input terminal of a multiplex (MUX) unit 132. In the exemplary embodiment of the invention, each ADC 110 provides a 13-bit signal to the multiplexer 132. The multiplexer 132 provides a sequence of the 13-bit signals applied to its input ports to a format converter 134. Each 13-bit value provided by the multiplexer 132 is in non-standard binary format. Format converter 134 converts each of these words into a standard 12-bit format to produce the output values of the ADC system shown in FIG. 1.

Each ADC 110 is driven by a clock and phase timing unit 138 which as shown here, generates eighteen phases P(0) to P(17), clock signal, CK, a phase-advanced clock signal, CKS, a clamp pulse CLAMPN. The clock phases P(0) through P(17) are generated by selecting one of eighteen consecutive clock pulses of the signal CK. This produces 18 clock signals, each having a respectively different phase and a frequency which is one-eighteenth of the frequency of the signal CK. Each of the ADCs 18 is driven by all of the phases P(0) through P(17), however, the clock phase which is P(1) for the first ADC 110 is clock phase P(0) for the second ADC 110 and clock phase P(17) for the third ADC 110.

Thus the eighteen ADCs 110 respectively and repeatedly sample the input voltage VIN at eighteen successive instants. This arrangement effectively results in a composite sampling rate for the entire ADC system assembly shown in FIG. 1 which is 18 times the sampling rate of an individual ADC 110. It is to be understood that the system may be configured with fewer (or more) ADCs 110 to achieve different sampling rates.

Each ADC 110 includes an auto-zero comparator 120 which produces a bit-serial output signal that is applied to a 12-bit successive approximation register (SAR) 122. Comparator 120 momentarily samples the input voltage VIN, and thereafter, in a clocked sequence in combination with the SAR 122, determines bit-by-bit the digital value of the sampled input voltage.

SAR 122 provides the four most-significant-bits (MSBs) of its stored value to a first four-bit DAC 124 which in turn provides a pair of analog voltages, DA1 and DA1R to the comparator 120. In a the same way, SAR 122 provides the four next MSBs, plus an offset bit, D06, to a second four-bit DAC 126. This DAC generates another pair of analog voltages, DA2 and DA2R which are applied to the comparator 120. The four least significant bits (LSBs) of the value held in the SAR 122 are converted by two 2-bit DACs 128 and 130, into four pairs of analog signals, DA3, DA3R, DA4, DA4R, DA5, DA5R, DA6 and DA6R. The DACs 124, 126, 128 and 130 are of the same design as in my above-referenced patent.

All of the ADCs 110 are connected to a single master voltage reference source 140, which is described below with reference to FIG. 5. The reference voltages VA0 through VA16, VAR0 through VAR16, VB0 through VB19 and VBR0 through VBR19 divide a range of voltages defined by a reference voltage low level signal, VRLF, and a reference voltage high level signal, VRHF.

The voltage reference signals, VRHF and VRLF are produced by a reference generator circuit 136. This circuit employs a band-gap voltage reference source (not shown) to generate these signals and a voltage reference signal VREF which has a nominal potential of 2.5 volts. In addition, the reference generator 136 uses a reference ground signal, RGND, which is nominally at the substrate ground potential but which is fully diode-isolated from the substrate. This configuration attenuates noise components of the substrate ground signal which propagate through the substrate, for example, from other ones of the ADCs 110. The reference generator circuitry 136 is not described in detail. Circuitry suitable for use as the reference generator 136 can be readily designed by one of ordinary skill in the art from the description presented below and the description presented in my above-referenced patent.

The signal CLK IN, which has a frequency of 20 MHz, is used, by the clock and phase timing circuitry 138, to generate 18 clock phase pulses, P0 through P17, and three delayed clock signals CK, CKS and CLAMPN. Each of the clock phase signals P0 through P17 is a pulse clock signal having a frequency of 1.11 MHz. Each pulse of one of these clock phase signals is a single pulse of the signal CK separated from the next pulse by 18 periods of the signal CK. Each of these clock signals is separated from the next clock signal by one period of the signal CK. If all 18 of the signals P0 through P17 were combined, the result would be the signal CK.

The signals CKS and CLAMPN have phases which are advanced from the phase of the signal CK. In the clock and phase timing circuitry, this is accomplished by producing the signals CKS and CLAMPN with less delay with respect to the signal CLK IN than the signal CK. In the exemplary embodiment of the invention, the signal CLAMPN is delayed with respect to the signal CKS. The circuitry 138 is not described in detail since suitable circuitry may be produced by one of ordinary skill in the art based on the description of the signals provided below and on my the above-referenced patent.

Figures 2, 2A, 2B, 2C:
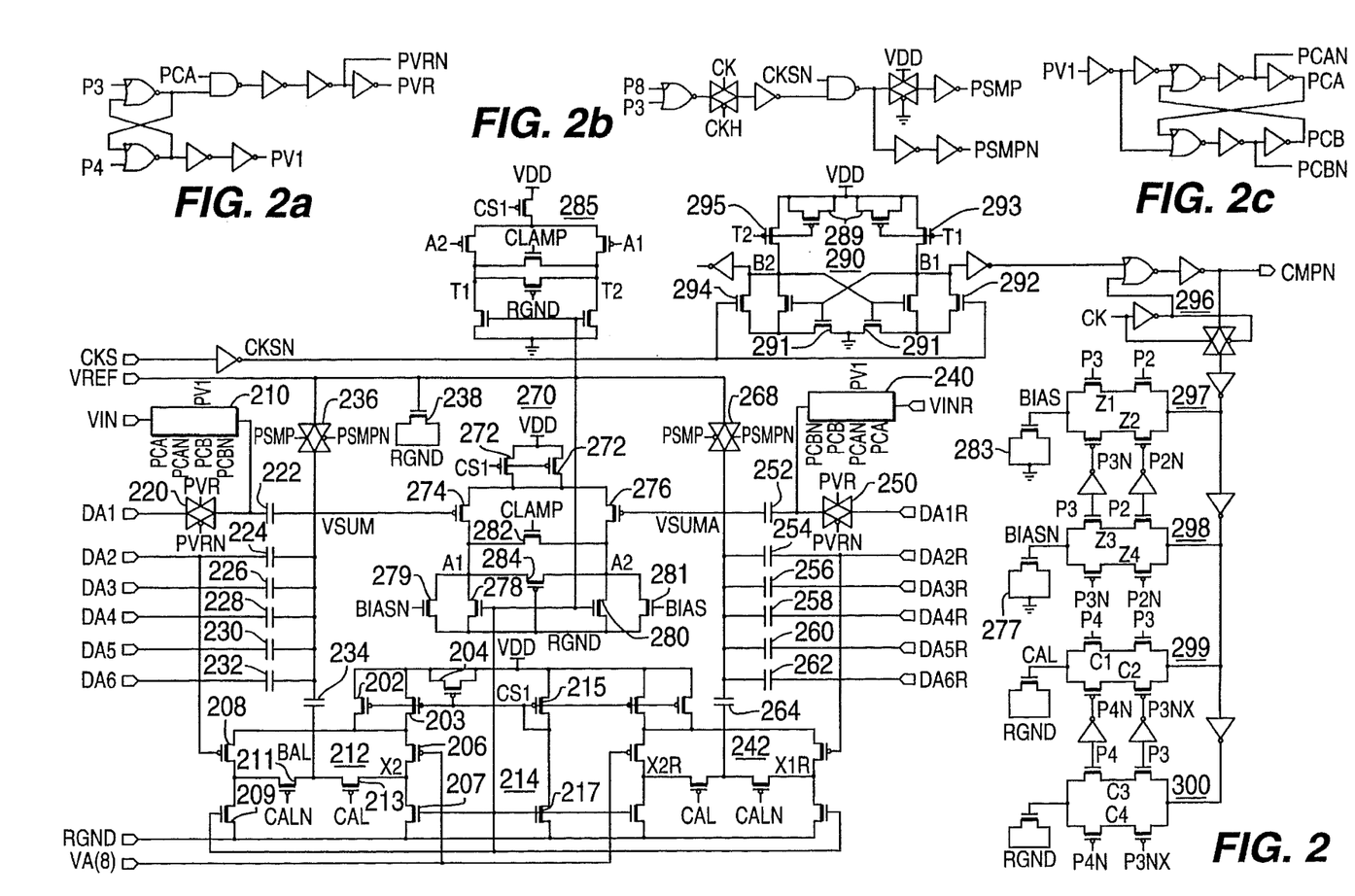
FIGS. 2, 2a, 2b and 2c are schematic diagrams, partly in logic diagram form, of a comparator circuit suitable for use in one of the ADCs shown in FIG. 1.

FIG. 2 is a schematic diagram, partly in logic diagram form, of an auto-zero comparator suitable for use as the comparator 110 of FIG. 1. In overview, the analog input signal VIN is applied to a summing network, which combines the input value with partial results generated by the DACs 124, 126, 128 and 130 at a node VSUM. The difference between the signal at this node and the signal at the node VSUMR is amplified, by a cascade combination of an auto-biased amplifier 270, and a differential amplifier 285. The output signal of the amplifier 285 is applied to a regenerative latch 290. The regenerative latch switches to a logic-high state, if the next bit in the digital value is to be a logic high value; or to a logic-low state, if the next bit in the digital value is to be a logic low value. The output signal of the auto-zero comparator is a signal CPMN, which is an inverted version of the instantaneous state of the latch 290.

The amplifier 270 is a differential amplifier which receives the input signal VIN at one input terminal and a signal VINR at the other input terminal. The signal VINR is the return path of the signal VIN. If, for example, the signal VIN is referenced to a ground plane as an input signal to the ADC shown in FIG. 1, then the terminal VINR is coupled to that ground plane. This return signal is applied to the ADC to nullify any high frequency common mode signals which may interfere with the signal VIN. To the extent that these signals also appear in the return path, they are nullified in the differential amplification performed by the circuitry shown in FIG. 2. In most instances, the signal VINR and the other signals applied to the node VSUMR are logic-zero values. Only when there are relatively high-frequency noise signals propagating from the substrate is the signal at node VSUMR non-zero. In these instances, however, the noise signals are also present at the node VSUM. Because it is the difference between the potentials at the nodes VSUM and VSUMR which is amplified by the amplifier 270, the noise signals tend to cancel and do not contribute significantly to the final result.

As described below, the ADC circuitry includes parallel circuitry for generating return path signals for the comparator shown in FIG. 2 which correspond to similar signals in the input path. This parallel circuitry is used to nullify common mode signals which may occur in the DACs 124, 126, 128 and 130 as well as in the voltage reference divider circuit 140. In the material that follows, the following conventions are used, a signal name ending in "R" represents a return path signal which corresponds to the signal having the same name but without the "R."

In the same way, a switching signal ending in the letter "N" is an inverted version of the switching signal of the same name but without the "N." For the sake of brevity, the inverter circuits which are used generate the complementary switching signals are not described.

As set forth above, the circuitry shown in FIG. 2 generates a complete 12-bit digital value representing an analog input value VIN during a digitizing interval which spans 18 cycles of the clock signal CK. The first steps performed in this interval are calibration steps. As described below, a sample of the input signal VIN is not provided until the positive-going transition of phase P4. The calibration steps occur during phases P0 through P3.

During phase P0, the SAR 122 is reset to provide values of logic-zero for the signals DA1, DA2, DA3, DA4, DA5 and DA6 as well as for the corresponding return signals DA1R, DA2R, DA3R, DA4R, DA5R and DA6R.

During the time intervals spanned by phases P1 and P2, the circuitry shown in FIG. 2b generates signals PSMP and PSMPN. These signals are applied to respective transmission gates 236 and 268 to precharge the respective nodes VSUM and VSUMR to the potential VREF. VREF is generated by the reference generator circuit 136 shown in FIG. 1. This circuit includes a voltage divider circuit (not shown) which sets the potential VREF approximately in the center of the range defined by a source of operational potential (e.g. $V_{DD}$) and a source of reference potential (e.g. ground). In the exemplary embodiment of the invention, $V_{DD}$ is +5 volts. Accordingly, the nominal value of VREF is 2.5 volts. The step of precharging the nodes VSUM and VSUMR to 2.5 volts biases the PMOS input transistors 274 and 276 to detect slight variations in potential from this 2.5 volt reference.

The nodes VSUM and VSUMR are set to this potential in order to accurately set the bias points of the preamplifier 270. The preamplifier 270 is implemented with a differential PMOS input stage (transistors 274 and 276) which have as their load elements a pair of NMOS current sources (transistors 278 and 280). The gate electrodes of the transistors 278 and 280 are coupled to receive the potential VREF, as such these transistors exhibit a fixed resistance path between the drain electrodes of the transistors 274 and 276 and ground.

The amplifier 270 also employs a common mode DC passive clamp circuit (transistor 284). The passive clamp circuit is a resistance which averages the potentials at nodes A1 and A2, the drain electrodes of the respective transistors 274 and 276, if either node exceeds the threshold potential of PMOS transistor 284. In addition to the passive clamp circuit, the amplifier 270 includes an active clamp circuit (transistor 282). This circuit forms a low-impedance path between the drain electrodes of the transistors 274 and 276 immediately before the comparison. This low impedance effectively resets the differential amplifier, preparing it to produce an output signal, between nodes A1 and A2, which represents the amplified difference between the signals VSUM and VSUMR.

Operational power is applied to the preamplifier 270 via transistor 272 which forms the output stage of a current mirror, the input stage of which is provided by transistor 215 of the gain adjust circuit 214, described below. Ideally, the amplifier 270 divides a fixed current between the transistors 274 and 276, based only on the relative values of the signals VSUM and VSUMR. The operating point of the amplifier is set by the load resistance defined by the transistors 278 and 280. In addition, the amplifier 270 includes two transistors, 279 and 281, which are controlled by the respective signals BIASN and BIAS, that adjust the bias point of the amplifier 270 to ensure that any difference between the potentials VSUM and VSUMR is amplified. In the exemplary embodiment of the invention, preamplifier 270 has a gain of approximately 10.

The transistors 274 and 276, as MOS devices, may be modeled as voltage variable current sources. In the circuit shown in FIG. 2, the channel current of each of the transistors 274 and 276 is determined by applying the potential VREF to their respective gate electrodes. To the extent, however, that there is a difference in the current provided by either transistor 274 or 276, there may be a range of differential input potentials for which the comparator 270 produces erroneous results. The bias circuit acts to automatically correct these errors by ensuring that the transistors 274 and 276 pass the same current when the potential VREF is applied to their gate electrodes. The operation of the automatic bias circuit is described below.

As set forth above, in the time interval defined by the phases P1 and P2, the signal VREF is applied to the gate electrodes of transistors 274 and 276. Ideally, both of the transistors 274 and 276 should be biased in their conductive regions at the same point and, so, should pass the same amount of current. If they do not, then the differential output signal between nodes A1 and A2 is non-zero. This potential is amplified by the differential amplifier 285 and is detected by the regenerative latch 290. The latch 290 passes the detected signal through a transmission gate 296 where it is inverted and applied to a first switched capacitor filter 297. The signal is inverted again and applied a second switched capacitor filter 298. In the filters 297 and 298, these signals charge parasitic capacitances at nodes Z1, Z2, Z3 and Z4, during phase P2. Any accumulated charge is then passed from the parasitic capacitances to the capacitors 283 and 277 during clock phase P3.

If there is an imbalance between transistors 274 and 276, one of the capacitors 277 and 283 is charged to a higher potential than the other capacitor. These potentials, BIASN and BIAS, in turn, are applied to the gate electrodes of the transistors 279 and 281. If BIASN is greater than BIAS, the load resistance provided by transistor 278 is reduced by a larger amount than the load resistance represented by transistor 280. This changes the relative biasing point of the transistors 274 and 276. This adjustment continues through several digitizing cycles until relatively stable values are established for the biasing potentials BIAS and BIASN. Once these potentials are established, the differential preamplifier 270 is biased such that even a small difference between VSUM and VSUMR is properly amplified and passed on to the second preamplifier 285.

In addition, when the difference signal between VSUM and VSUMR is sufficiently large, the ON resistance of the passive clamp transistor 284 serves as a load for the PMOS differential input transistors 274 and 276. This load resistance lowers the voltage gain and output impedance of the preamplifier circuit 270, thereby reducing the time constant of the preamplifier and improving its transient response recovery time. Due to the differential (i.e. antiphasal) nature of the signal voltages at nodes A1 and A2, the average potential developed by the transistor 284, has only a small signal component. The output signals A1 and A2 of the preamplifier 270 are applied to the respective input terminals A1 and A2 of the preamplifier 285.

The preamplifier 285 is essentially the same as preamplifier 270 except that the amount of operational current is halved and there is no automatic biasing circuit. Accordingly, the preamplifier 285 is not described in detail. The output signal of the preamplifier 285 is provided as the potential difference between nodes Y1 and Y2. In the exemplary embodiment of the invention, the preamplifier 285 has a gain of approximately 6, accordingly, any difference between VIN and VINR is amplified by a factor of 60 before it is applied to the differential latch 290.

This potential difference is applied to the gate electrodes of the transistors 295 and 293 of the differential latch 290. The latch 290 is essentially the same as that described in my above-referenced patent except for the addition of the capacitors 291. These capacitors limit the noise bandwidth of the latch and thereby improve its sensitivity. Before each pulse of the signal CK, a phase leading clock signal, CKSN is applied to the gate electrodes of two transistors 292 and 294. These transistors, when they become conductive, discharge the capacitors 291, effectively resetting the latch 290. Immediately after the latch is reset, its next state is determined by the differential between the potentials Y1 and Y2 provided by the amplifier 285.

The state of the latch 290 is inverted and applied to a gating circuit which gates the state signal by the signal CK to ensure that only valid state values are provided synchronous with the positive-going pulse of the signal CK. The gated signal is inverted and provided as the output signal of the comparator, CMPN.

In normal operation, after the calibration steps are performed in phases P0 through P3 as described above, the input signal VIN and the return signal VINR are sampled onto respective capacitors 222 and 252 using constant impedance sampling switches 210 and 240. These switches are described below with reference to FIG. 3. Other input signals to the summing junction VSUM are analog potentials, DA2, DA3, DA4, DA5 and DA6, while other input signals to the summing junction VSUMR are analog potentials DA2R, DA3R, DA4R, DA5R and DA6R. These potentials are provided by the DACs 126, 128 and 130, shown in FIG. 1. A final input signal to the summing junction VSUM is a signal BAL, applied by the gain adjust circuit 234, via the capacitor 918. During phase P4, the potentials DA2, DA2R, DA3, DA3R, DA4, DA4R, DA5, DA5R, DA6 and DA6R are fixed at their nominal low levels while VIN is sampled. In this configuration, the left side of capacitor 222 is charged to VIN and the right side of capacitor 222 is charged to VREF while the right and left sides of capacitor 252 are charged to VINR and VREF, respectively.

Next, the transmission gates 236 and 268 are turned off responsive to the signals PSMP AND PSMPN, disconnecting the nodes VSUM and VSUMR from VREF. This may change the voltage on VSUM by a small residual offset value due to an imbalance in the capacitively coupled clock component from the negative-going transition of PSMP and the positive-going transition of PSMPN.

Next, the constant impedance sampling switches 210 and 240 disconnect the respective capacitors 222 and 252 from the input signals VIN and VINR. The transmission gates 220 and 250 are turned on, connecting the left side of the capacitor 222 to the analog potential DA1 and connecting the right side of the capacitor 252 to the analog potential DA1R. Both DA1 and DA1R are provided by DAC 124. After a defined settling time, the voltage at nodes VSUM and VSUMR are determined in accordance with the equations (1) and (2).

$$VSUM = VREF + (DA1-VIN)*(C222/CT) + DA2*(C224/CT) + DA3*(C226/CT) + DA4*(C228/CT) + DA5*(C230/CT) + DA6*(C232/CT) + BAL*(C234/CT) \quad (1)$$

$$VSUMR = VREF + (DA1R-VINR)*(C252/CTR) + DA2R*(C254/CTR) + DA3R*(C256/CTR) + DA4R*(C258/CTR) + DA5R*(C260/CTR) + DA6R*(C262/CTR) + BALR*(C264/CTR) \quad (2)$$

where BAL and BALR are the potentials developed at the output terminals of the gain adjust circuit 214, described below, Cx represents the capacitance of capacitor X and CT and CTR are the respective total capacitances on nodes VSUM and VSUMR, respectively as defined by equations (3) and (4).

$$CT = C222 + C224 + C226 + C228 + C230 + C232 + C234 + Cpsum \quad (3)$$

$$CTR = C252 + C254 + C256 + C258 + C260 + C262 + C264 + CpsumR \quad (4)$$

where Cpsum and CpsumR are the parasitic capacitance on respective nodes VSUM and VSUMR.

Note that the voltage at node VSUM corresponds to the difference between the input signal VIN on one hand and the sum of the potentials DA1 through DA6 provided by the DACs 124, 126, 128 and 130 on the other hand. In the same way, the potential at node VSUMR corresponds to the difference between the return signal VINR and the sum of the potentials DA1R through DA6R. The capacitors are scaled to sum the charges provided by the DACs 124, 126, 128 and 130 in proper proportions. In the exemplary embodiment of the invention, the capacitors 222 through 234 and the capacitors 252 through 264 have values as shown in Table 1, assuming a unit capacitance value of C.

TABLE 1

| Capacitor | Value |
|---|---|
| 222 252 | 16 C |
| 224 254 | 8 C |
| 226 256 | C |
| 228 258 | C |
| 230 260 | C |
| 232 262 | C |
| 234 264 | C |

In the exemplary embodiment of the invention, C is 50 femtofarads (fF).

Variations in the exact capacitance ratio of capacitor 222 to capacitor 224, and of capacitor 252 to capacitor 254, which ratio is nominally 2, are compensated in the autocalibration loop by the gain adjust circuit 214.

In the exemplary embodiment of the invention, all capacitors are made using deposited inter-level dielectric films. As is well know, capacitors made in this manner may be typically matched to better than 1% over small layout dimensions (approximately 120 μm by 120 μm). Capacitances can be effectively multiplied by using parallel combinations of matched capacitors. The inventors have determined that, using these techniques, the relative values of the capacitors used in each of the auto-zeroed comparators 120 may be controlled to achieve an accuracy of better than ±0.25 LSB for the 12-bit ADC.

The gain adjust circuit 214 provides a highly linear variable attenuation of the voltages DA2 and DA2R. In the exemplary embodiment of the invention, this attenuation is applied over an input signal range of 0 to 250 mv. The gain of the circuit 214 is adjustable from +0.2 to −0.2. The DC offset of the output signals BAL and BALR provided by the gain adjust circuit 214 are not critical since, in this application, these signals are capacitively coupled to the node VSUM and VSUMR. The circuit 214 has, however, been designed to provide good common mode rejection for variations in $V_{DD}$ and VREF.

The gain adjust circuit 214 includes two identical circuits, 212 and 242 which provide the respective signals BAL and BALR. For the sake of brevity only one of these circuits, 212 is described in detail. The gain adjust circuit uses calibration potentials, CAL and CALN which are generated by two switched capacitor filters 299 and 300. These filters operate in the same manner as the switched capacitor filters 297 and 298, described above, except that the filters 299 and 300 operate to accumulate the output signal provided by the latch 290 during phase P3 while the filters 297 and 298 operate to accumulate the output signal provided during phase P2. The output signal of the latch 290 during phase P3 is the amplified difference between VSUM and VSUMR which is measured during the autocalibration phase P2. If $V_{FS}$ is the full-scale voltage that may be converted by the ADC 110, during the autocalibration cycle of phase P2, DA1 is switched from $V_{FS}/16$ to zero while DA2 is switched from 0 to $V_{FS}/16$ (the highest potential that can be provided for the signal DA2). The net change on VSUM and VSUMR after these changes should be zero. To the extent that this difference signal is non-zero, it is sensed and accumulated to form the signals CAL and CALN. Thus, the signals CAL and CALN cause the linear differential attenuators 212 and 242 to compensate for slight differences between the input values DA1 and DA2 applied to the differential amplifier 270 which are caused by a variation from the desired capacitance ratios.

The linear differential attenuator 212 is formed by transistors 202, 203, 204, 206, 207, 208, 209, 211 and 213. This attenuator sums portions of inverted and non-inverted signals derived from the signal DA2, one of the output signals of the DAC 126, based on the control voltages CAL and CALN to generate the control potential BAL.

The input signal to the linear differential attenuator is the signal DA2 provided by the DAC 126. It is this signal which is attenuated and then added back to the signal at the summing junction VSUM to compensate for variations in capacitor ratios between capacitors 222 and 224.

The linear differential attenuator 212 is controlled by the signals CAL and CALN. Transistors 206 and 208 form a PMOS differential pair that divides current provided by transistors 202 and 203 which are on the output legs of the current mirror. The input leg of the current mirror are the transistors 215 and 217. The gate electrode of transistor 217 is coupled to receive the potential VREF and, so to draw a fixed current through transistor 215. Because transistors 215, 202 and 203 are configured as a current mirror, the drain current of each of the transistors 202 and 203 matches the drain current of transistor 215.

Since the gate electrode of the PMOS transistor 206 is coupled to VA(0), the differential amplifier is balanced when the potential DA2 is equal to 0 volts. In this instance the drain current flowing in both transistors 206 and 208 is equal to the current flowing through transistor 217. Transistors 202 and 203 have relatively low impedances and operate as resistors in the linear portion of their respective output characteristics with a relatively small drain to source voltage drop (Vds). The signal at node X1 is of opposite phase to the signal DA2, applied to the gate electrode of transistor 208 while the signal at node X2 is in phase with the signal DA2.

The output signal BAL of the gain adjust circuit 212 is a linear summation of the potentials at nodes X1 and X2 which, depending on the resistance ratio of transistors 211 and 213 (proportional to the ratio of CAL and CALN), may be in phase with or out of phase with the signal DA2. This circuit provides an adjustment range in gain from about −0.02 to +0.02. in the DAC 126 shown in FIG. 1, this is sufficient to compensate for expected variations in capacitance ratios between the capacitors 222 and 224 and between the capacitors 252 and 254.

Figure 3:
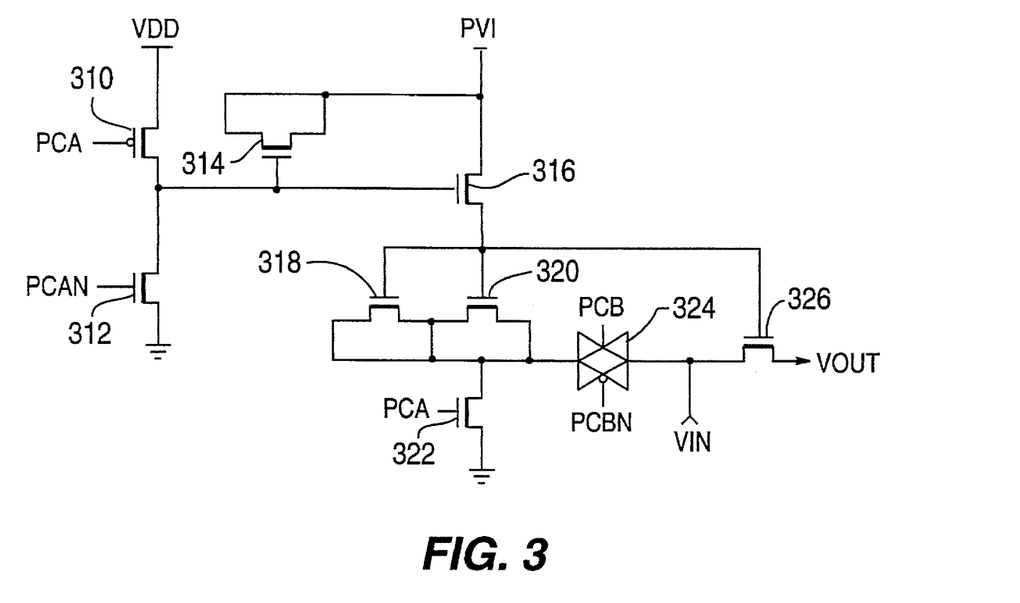
FIG. 3 is a schematic diagram of a constant impedance sampling switch suitable for use in the comparator circuit shown in FIG. 2.

FIG. 3 is a schematic diagram of circuitry suitable for use as the constant impedance sampling switch (CISS) 210. Identical circuitry may also be used for the switch 240. The constant impedance switches 210 and 240 replace transmission gates for gating the input signals VIN and VINR onto the respective notes VSUM and VSUMR. As described above, when a simple transmission gate is used to selectively gate the input signal to the sampling capacitor, nonlinear resistances in the transmission gate can cause harmonic distortion in the input signal defined by VIN and VINR.

The circuit shown in FIG. 3 avoids this harmonic distortion by providing a pair of sampling switches 210 and 240 which have a substantially constant impedance regardless of the amplitude of the signal being sampled. The switches 210 and 240 are identical, accordingly, only switch 210 is described in detail. In summary, signal VIN is selectively passed (sampled) by an electrically controlled switch, the NMOS transistor 326. It is contemplated that other types of electrically controlled devices, such as junction FETs, bipolar transistors, vacuum tubes and four-layer devices may be used in place of the transistor 326 with appropriate modification of the remaining circuitry shown in FIG. 3. In the exemplary embodiment of the invention, the gate electrode of transistor 326 is controlled such that, when the transistor is in its conductive state, $V_{GS}$ is held at a nearly constant value, close to $V_{DD}$, independent of the instantaneous potential of the signal VIN being passed by the transistor 326.

The switch is controlled by signals PVI, PCA, PCAN, PCB and PCBN. The signal PVI is generated by the circuitry shown in FIG. 2a. The signals PCA, PCAN, PCB and PCBN are generated, from the signal PVI by the circuitry shown in FIG. 2c.

Referring to FIG. 3, when the control signal PVI is logic-zero (e.g. 0 volts), the signal PCA is logic-one (e.g. 5 volts) and the signal PCB is logic-zero. In this state, transistors 310 and 322 are conductive and transistor 312 is non-conductive, accordingly, the gate electrode of transistor 316, and the capacitor formed by transistor 314 are charged to a potential substantially equal to $V_{DD}-V_{tn}$ (e.g. 4 volts, where $V_{tn}$ is the threshold voltage for an NMOS transistor). This renders transistor 316 conductive and, since PVI is logic-zero, discharges the capacitor formed by the transistors 318 and 320 and the gate electrode of transistor 326 to a logic-zero state. In addition, because PCB is logic-zero, the transmission gate 324 is non-conductive and VIN is completely isolated from VOUT.

A positive-going transition of PVI begins a timed switching sequence in which, 2 ns after PVI has become logic-one, PCA becomes logic-zero and, after another 2 ns, PCB becomes logic-one. As PVI becomes logic-one, the capacitor 314 causes the gate electrode of transistor 316 to be at a potential of approximately 9 volts and transistor 316 remains conductive. The logic-one signal passed by the transistor 316 charges the capacitor formed by the transistors 318 and 320 and the gate electrode of the transistor 326 to approximately 5 volts. Transistors 310, 314, 316 and 322 operate as a precharging circuit when PVI and PCA are a logic-one. After 2 ns, when PCA becomes logic-zero, transistor 322 becomes non-conductive, isolating the bottom terminal of the capacitor formed by the transistors 318 and 320. At the same time, transistor 312 becomes conductive and the capacitor 314 is discharged, rendering transistor 316 non-conductive. After a further 2 ns, the signal PCB becomes logic-one rendering the transmission gate 324 conductive, connecting the bottom of the capacitor 318, 320 to the input signal VIN.

Transistors 318, 320, and transmission gate 324 operate as a bootstrap circuit when PVI is a logic one, PCA is a logic-zero and PCB is a logic-one. Due to the charge stored on the capacitor 318, 320, the gate electrode of transistor 326 is "bootstrapped" to a potential approximately equal to VIN +5 volts. Because the gate-to-source voltage for the transistor 326 is held at a fixed value by the storage capacity of the capacitor 318, 320, the impedance of the switching transistor 326 remains nearly constant for a wide range of values of the input signal VIN.

Thus the constant impedance sampling switches 210 and 240 pass the respective signals VIN and VINR substantially free of any harmonic distortion during the time between the positive-going transition of clock phase P3 and the positive-going transition of clock phase P4, when the signal PVI is logic-one.

Figure 4:
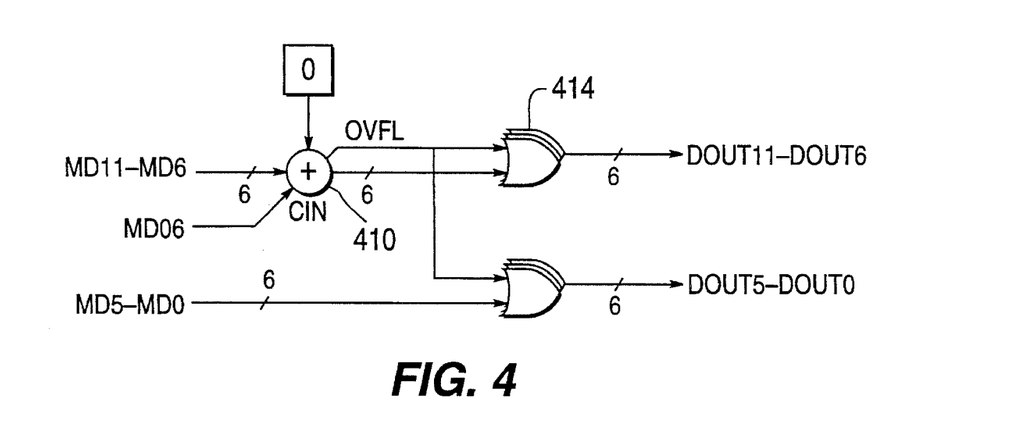
FIG. 4 is a logic diagram of circuitry suitable for use as the format converter shown in FIG. 1.

FIG. 4 is a logic diagram of a format converter suitable for use in the ADC shown in FIG. 2. In this circuit, the output signals MD6 through MD11 of the SAR 122 are applied to one input port of a six-bit adder 410 while a zero-valued signal is applied to the other input port. The signals D06 and MD06, provided by the SAR 122 are used in the same manner as the signals D04 and MD04 described in my above-referenced patent, to compensate for the offset voltage that is used to reduce the settling time of the input circuitry when the higher order bits of the digital value are being determined. The signal MD06 is applied to the carry-in (CIN) input terminal of the adder 410. The individual bits of the output value of the adder 410 are applied to first input terminals of respectively different OR gates 414. The second input terminals of these gates are coupled to receive the overflow output signal (OVFL) of the adder 410. The signal OVFL is also coupled to the second input terminals of four OR gates 416, the first input terminals of which are coupled to receive the output signals MD0 through MD5 of the SAR 122. The output signals of the OR gates are the output signals DOUT0 through DOUT11 of the ADC.

Figure 5:
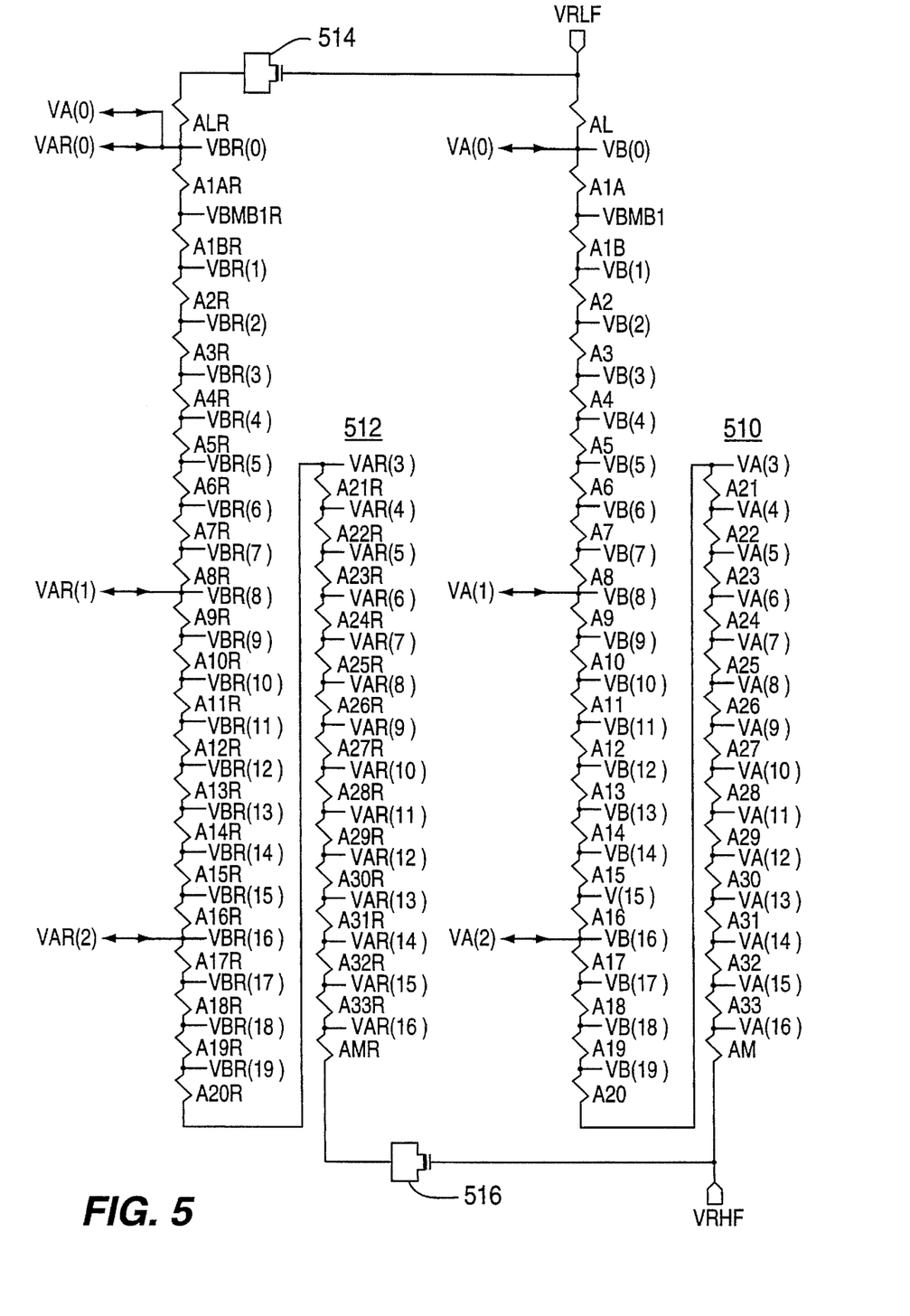
FIG. 5 is a schematic diagram of a reference voltage divider circuit which is suitable for use in the ADC system shown in FIG. 1. Detailed Description

FIG. 5 is a schematic diagram of the two voltage divider networks 510 and 512 which are used to generate the voltages VA(0) through VA(16), VB(0) through VB(19), VAR(0) through VAR(16) and VBR(0) through VBR(19) which are used by the DACs 124, 126, 128 and 130, shown in FIG. 1 to generate the signals DA1 through DA6 and DA1R through DA6R. The network 510 is coupled to divide the difference between a high reference voltage, VRHF, and a low reference voltage, VRLF, to produce the reference voltages VA(0) through VA(16) and VB(0) through VB(19).

The network 512 is capacitively coupled, via the capacitors 514 and 516, to the voltage sources VRHF and VRLF to produce the reference voltages VAR(0) through VAR(16) and VBR(0) through VBR(19). In addition, the tap in the network 512 which produces the reference voltage VAR(0) is connected to the tap in the network 510 which produces the reference voltage VA(0). Because the network 512 is capacitively coupled to the reference high source and reference low source, it does not provide direct current (DC) voltages. The reference voltages VAR(0) through VAR(16) and VBR(0) through VBR(19) are nonzero only when there is a significant noise signal propagating into the ADC system, for example, through the substrate of the integrated circuit on which the ADC system is formed. Without the network 512, the signals DAR0 through DAR6 and the summing network VSUMR, these signals would interfere with the operation of the differential circuitry of the ADC system as common mode signals.

To obtain a highly accurate resistor divider, the resistors are desirably implemented in a heavily doped material, such as N+ polysilicon and placed on a thick dielectric glass to reduce bottom surface depletion. Additionally, if an N-well resistor is placed under the reference resistor and driven with the same voltage at its ends, then the local normal electric field on the bottom of the reference resistor will be constant.

Exemplary values for the resistors shown in FIG. 5 are shown in Table 2.

TABLE 2

| Resistor | Value |
| --- | --- |
| RL, RLR, RH, RHR | 6Ω |
| R1A, R1B, R1AR, R1BR | 2Ω |
| R2–R19 & R2R–R19R | 4Ω |
| R20, R20R | 20Ω |
| R21–R33 & R21R–R33R | 32Ω |

As shown in FIG. 5, the reference voltages VA(0) through VA(16) are generated using a resistor ladder network which includes a series of 32 Ω resistances. The voltages VB(0) through VB(19), on the other hand, are generated using a sub-network of the network which generates the VA reference voltages. This subnetwork is a series connection of 4 Ω resistors which are used, at least in part, to form the 32 Ω resistances used to develop the reference voltages VA(1) through VA(3). The same analysis applies for the return reference voltages VAR(0) through VAR(19) and VBR(0) through VBR(19).

The output signals D(0) through D(6), D06, and D(7) through D(11) of the SAR 122, shown in FIG. 1 are applied to the DACs 124, 126, 128 and 130. These DACs operate in the same way as the corresponding DACs in my above-referenced patent except that each of the DACs used in the exemplary embodiment of the invention include a pair of DACs, one which is coupled to the resistor ladder network 510 and the other of which is coupled to the resistor ladder network 512. The DACs coupled to receive reference analog signals VA and VB from the network 510 produce the output signals DA1 through DA6. The DACs coupled to receive the signals VAR and VBR from the network 512 produce the output signals DA1R through DA6R.

It is to be understood that the embodiments described herein are illustrative of the general principles of the invention. Modifications may readily be devised by those skilled in the art without departing from the spirit and scope of the invention. For example, it is contemplated that the constant impedance switching circuit may be used advantageously in other types of ADCs and in any other application in which a signal having relatively high frequencies is passed through a transmission gate. Examples of such circuits are crosspoint switches and gated comparators. The use of this circuit in these applications would ensure that the input signal is substantially free of harmonic distortion.

I claim:

1. A constant impedance sampling switch which presents a substantially constant impedance to an input signal substantially regardless of the instantaneous level of the input signal comprising:

an electrically controlled switch responsive to a control signal to selectively couple the input signal to a sampling circuit;

a terminal which receives a switching signal to initiate a sampling sequence by the constant impedance sampling switch;

precharging circuitry which generates a stored potential responsive to a first delayed switching signal; and bootstrapping circuitry which couples the stored potential to the input signal, responsive to a second delayed switching signal, to generate the control signal for the electrically controlled switch.

2. A constant impedance sampling switch according to claim 1, wherein the electrically controlled switch is a single MOS transistor having a source electrode coupled to receive the input signal, a drain electrode coupled to the sampling circuit and a gate electrode coupled to receive the control signal.

3. A constant impedance sampling switch according to claim 2, further including:

timing circuitry which generates the first and second delayed switching signals responsive to the switching signal, the first and second delayed switching signals having transitions which are delayed with respect to corresponding transitions of the switching signal.

4. A constant impedance switching circuit comprising:

an input terminal for receiving an input signal;

an output terminal for providing an output signal;

switching means having a conductive channel defined between the input terminal and the output terminal, the conductive channel being controlled responsive to a relative difference in amplitude between a control signal applied to a control electrode and the input signal;

control means for generating the control signal for the switching means, comprising:

precharging means for generating a first signal having a first value, relative to a predetermined reference signal, when the switching means is to be conductive and a second value, relative to the predetermined reference signal, when the switching means is to be nonconductive, and for decoupling the first signal from the predetermined reference signal in response to a first delayed switching signal; and bootstrapping means, coupled to the input terminal and the first signal for bootstrapping the first signal onto the input signal to form a bootstrapped signal and for applying the bootstrapped signal to the switching means, as the control signal, in response to a second delayed switching signal.

5. A constant impedance switching circuit according to claim 4, wherein the control means further comprises:

means for receiving a switching signal which is in a first state when the switch is to be conductive and which is in a second state otherwise; and means, responsive to the switching signal for generating the first and second delayed switching signals having transitions which are delayed by first and second amounts of time relative to corresponding transitions of the switching signal;

wherein the precharging means is coupled to the switching signal and responsive to the switching signal being in the first state for generating the first signal.

6. A constant impedance switching circuit according to claim 5, wherein:

the switching means is an N-channel metal-oxide-semiconductor (NMOS) transistor having the conductive channel defined between respective source and drain electrodes and having a gate electrode as the control electrode;

the precharging means includes:

a capacitor, having a first end and a second end;

a first switch coupled between the first end of the capacitor and a source of relatively positive potential, said first switch being responsive to the first delayed switching signal for selectively coupling the first end of the capacitor to the source of relatively positive potential; and a second switch coupled between the second end of the capacitor and a source of relatively negative potential, the second switch being responsive to the first delayed switching signal for selectively coupling the second end of the capacitor to the source of relatively negative potential.

7. A constant impedance switching circuit according to claim 6, wherein the source of relatively positive potential is the switching signal.

* * * * *